United States Patent
Sanji et al.

(10) Patent No.: US 12,550,309 B2
(45) Date of Patent: Feb. 10, 2026

(54) COMPONENT MOUNTING SYSTEM

(71) Applicant: FUJI CORPORATION, Chiryu (JP)

(72) Inventors: Mitsuru Sanji, Toyota (JP); Kohei Ishikawa, Hekinan (JP)

(73) Assignee: FUJI CORPORATION, Chiryu (JP)

( * ) Notice: Subject to any disclaimer, the term of this patent is extended or adjusted under 35 U.S.C. 154(b) by 495 days.

(21) Appl. No.: 18/248,968

(22) PCT Filed: Nov. 6, 2020

(86) PCT No.: PCT/JP2020/041607
§ 371 (c)(1),
(2) Date: Apr. 13, 2023

(87) PCT Pub. No.: WO2022/097288
PCT Pub. Date: May 12, 2022

(65) Prior Publication Data
US 2023/0389251 A1  Nov. 30, 2023

(51) Int. Cl.
*H05K 13/08* (2006.01)
(52) U.S. Cl.
CPC ..... *H05K 13/0882* (2018.08); *H05K 13/0812* (2018.08); *H05K 13/086* (2018.08)
(58) Field of Classification Search
CPC ........... H05K 13/0882; H05K 13/0812; H05K 13/086
See application file for complete search history.

(56) References Cited

U.S. PATENT DOCUMENTS

2015/0248314 A1*  9/2015  Morita ................ H05K 13/085
718/104

FOREIGN PATENT DOCUMENTS

| JP | 11-177281 A | 7/1999 |
| JP | 2005-159160 A | 6/2005 |
| JP | 2009-71137 A | 4/2009 |
| WO | WO 2014/068712 A1 | 5/2014 |
| WO | WO 2020/166050 A1 | 8/2020 |

OTHER PUBLICATIONS

International Search Report issued Jan. 12, 2021 in PCT/JP2020/041607 filed Nov. 6, 2020, 2 pages.

* cited by examiner

*Primary Examiner* — Gary Collins
(74) *Attorney, Agent, or Firm* — Oblon, McClelland, Maier & Neustadt, L.L.P.

(57) ABSTRACT

A component mounting system includes an execution procedure determination section for determining an execution procedure of multiple mounting jobs, and a job switching section for switching the mounting jobs. The job switching section holds, in the attachment target section, a feeder accommodating a component common to a component used in the subsequent mounting job among components used in the previous mounting job when the previous and subsequent successive mounting jobs in the execution procedure are switched, and mounts, on an empty attachment target section among the multiple attachment target sections, a feeder accommodating a component not common to a component used in the previous mounting job among components used in the subsequent mounting job.

5 Claims, 12 Drawing Sheets

Fig. 7

| JOB (PRODUCTION MODEL) |
|---|
| JOB_A |
| JOB_B |
| JOB_C |
| JOB_D |
| JOB_E |
| JOB_F |

⇧

| EXECUTION PROCEDURE | | JOB (PRODUCTION MODEL) | COMMONALITY OF COMPONENTS | |
|---|---|---|---|---|
| 1 | | JOB_A | 73 | |
| 2 | | JOB_B | | 82 |
| 3 | | JOB_C | 93 | |
| 4 | | JOB_D | | 65 |
| 5 | | JOB_E | 66 | |
| 6 | | JOB_F | | |

⇧

| EXECUTION PROCEDURE | | JOB (PRODUCTION MODEL) | COMMONALITY OF COMPONENTS | |
|---|---|---|---|---|
| 1 | | JOB_A | 92 | 89 |
| 2 | | JOB_E | | 91 |
| 3 | | JOB_D | 93 | |
| 4 | | JOB_C | | 85 |
| 5 | | JOB_F | 91 | |
| 6 | | JOB_B | | |

COMPONENT MOUNTING SYSTEM

TECHNICAL FIELD

The present specification discloses a component mounting system.

BACKGROUND ART

Conventionally, there has been known a front surface mounting machine that sets a production procedure of multiple types of boards, sets the boards according to the set production procedure, and mounts components. For example, Patent Literature 1 discloses a configuration in which a printed circuit board to be first subjected to mounting processing is used as a reference among multiple types of printed circuit boards, and the types of printed circuit boards to be produced thereafter are set in the descending procedure of the number of types of components overlapping with the mounted component with respect to the printed circuit board to be first subjected to mounting processing, and in the descending procedure of the number of components overlapping with a position of a tape feeder for supplying the overlapping components.

PATENT LITERATURE

Patent Literature 1: JP-A-2005-159160

BRIEF SUMMARY

Technical Problem

However, it may not always be an appropriate procedure to set the execution procedure (production procedure) of mounting jobs for mounting the components in the descending procedure of the number of types of components that overlap with the mounting components on the printed circuit board for which the mounting processing is executed first. A setup change is performed, for example, when the mounting job during the execution is completed, by holding a feeder used in a next mounting job among the feeders used in the mounting job during the execution in the component mounting machine, taking out a used feeder not used in the next mounting job from the component mounting machine, and attaching a new feeder used in the next mounting job to the component mounting machine. In this case, when the execution procedure of the mounting jobs is set in the descending procedure of the types of components that overlap with the mounting component on the previous mounting job, since the number of types of overlapping components is minimized in the setup change for a last mounting job, there is a concern that the number of feeders to be exchanged increases, and a long waiting time occurs before the production is started.

A main object of the present disclosure is to provide a component mounting system capable of suppressing an occurrence of a long waiting time between parts of mounting jobs in switching of the mounting jobs to improve production efficiency in a case where multiple mounting jobs are subsequently executed.

Solution to Problem

The present disclosure employs the following means in order to achieve the above-mentioned main object.

A component mounting system of the present disclosure is a component mounting system includes:
- a component mounting machine configured to execute a mounting job taking out and mounting components supplied from a feeder mounted on any of multiple attachment target sections,
- the component mounting system for managing multiple mounting jobs to be executed by the component mounting machine, the component mounting system further including:
- an execution procedure determination section configured to obtain a sum value or a lowest value of a ratio of components used in common between previous and subsequent successive mounting jobs when the component mounting machine respectively executes the multiple mounting jobs in multiple assumed procedures, and determine the execution procedure of the multiple mounting jobs based on the sum value or the lowest value respectively obtained in the multiple procedures; and
- a job switching section configured to hold, in the attachment target section, a feeder accommodating a component common to a component used in the subsequent mounting job among components used in the previous mounting job when the previous and subsequent successive mounting jobs in the execution procedure determined by the execution procedure determination section are switched, and mount, on an empty attachment target section that is a attachment target section emptied among the multiple attachment target sections, a feeder accommodating a component not common to a component used in the previous mounting job among components used in the subsequent mounting job.

In the component mounting system of the present disclosure, in a case where multiple mounting jobs are executed, the time required for the setup change can be leveled between the respective mounting jobs. As a result, it is possible to suppress an occurrence of a long waiting time between parts of mounting jobs in switching of the mounting jobs and improve production efficiency.

BRIEF DESCRIPTION OF DRAWINGS

FIG. 7 is an explanatory diagram illustrating an example of the execution procedure of multiple jobs and a commonality of components used between two previous and subsequent successive jobs in a case where multiple jobs are executed in that procedure.

DESCRIPTION OF EMBODIMENTS

Next, an embodiment of the present disclosure will be described while referring to accompanying drawings.

Figure 1:
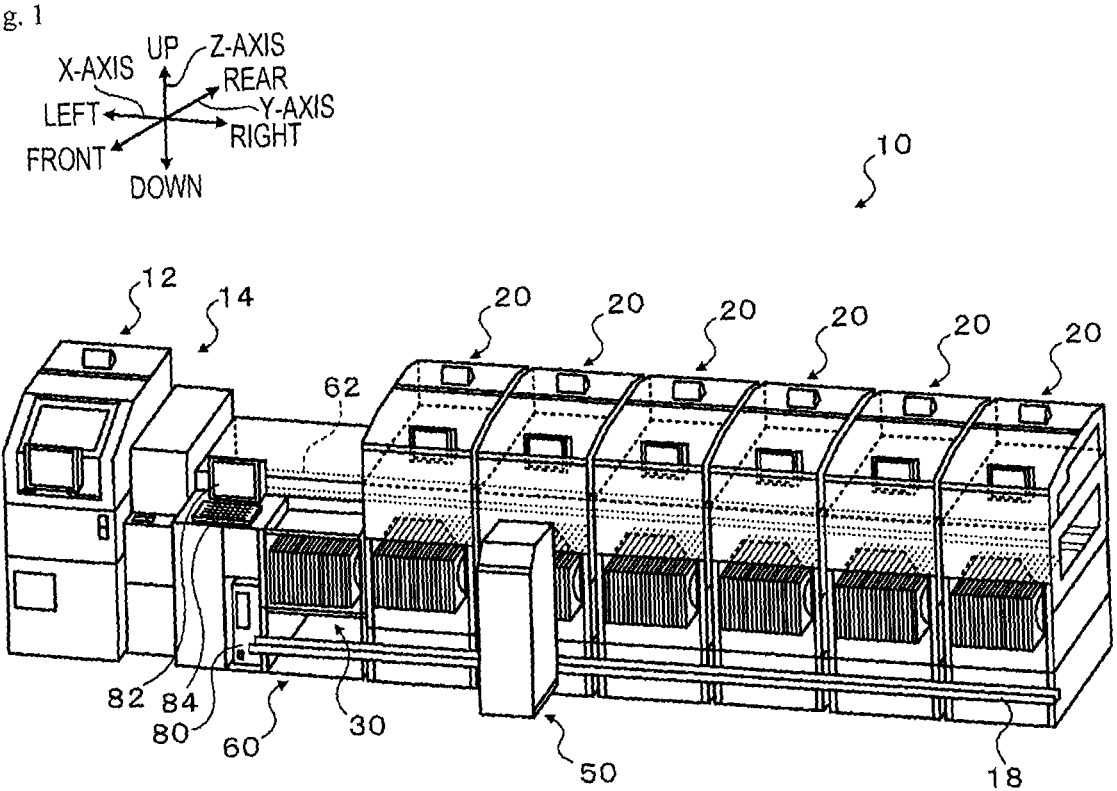
FIG. 1 is a schematic configuration diagram of a component mounting system.
Figure 2:
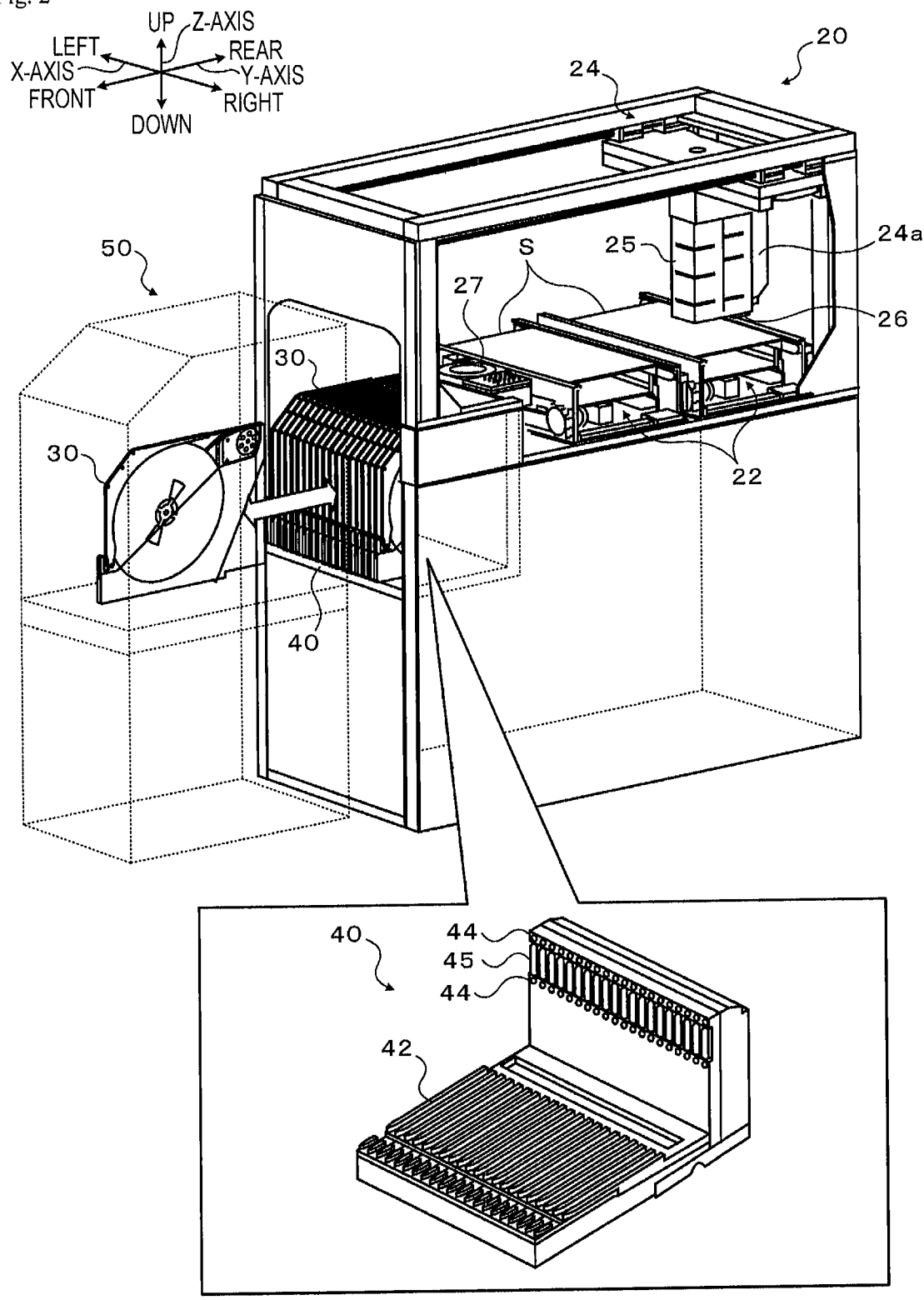
FIG. 2 is a schematic configuration diagram of a component mounting machine and a feeder.
Figure 3:
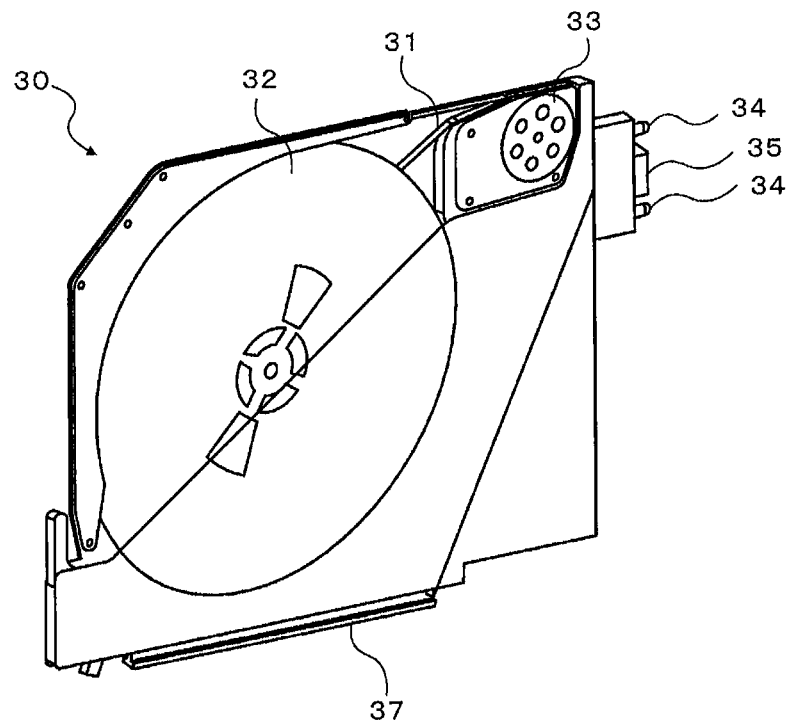
FIG. 3 is a schematic configuration diagram of the feeder.
Figure 4:
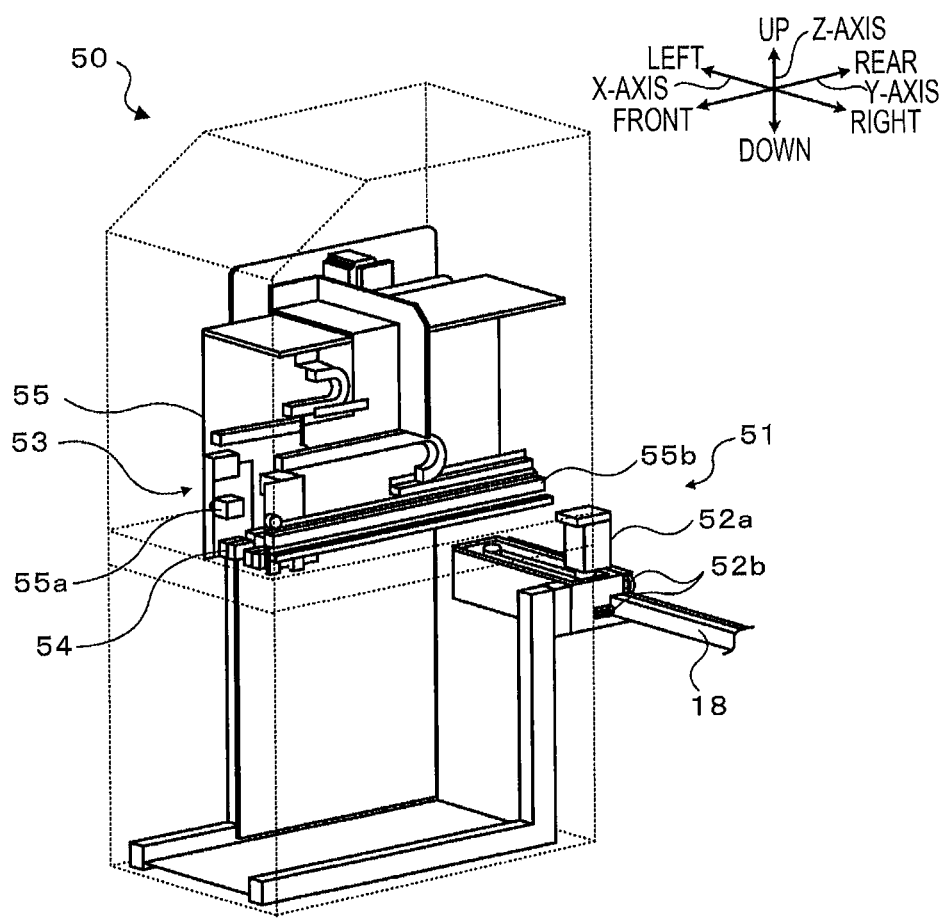
FIG. 4 is a schematic configuration diagram of a loader.
Figure 5:
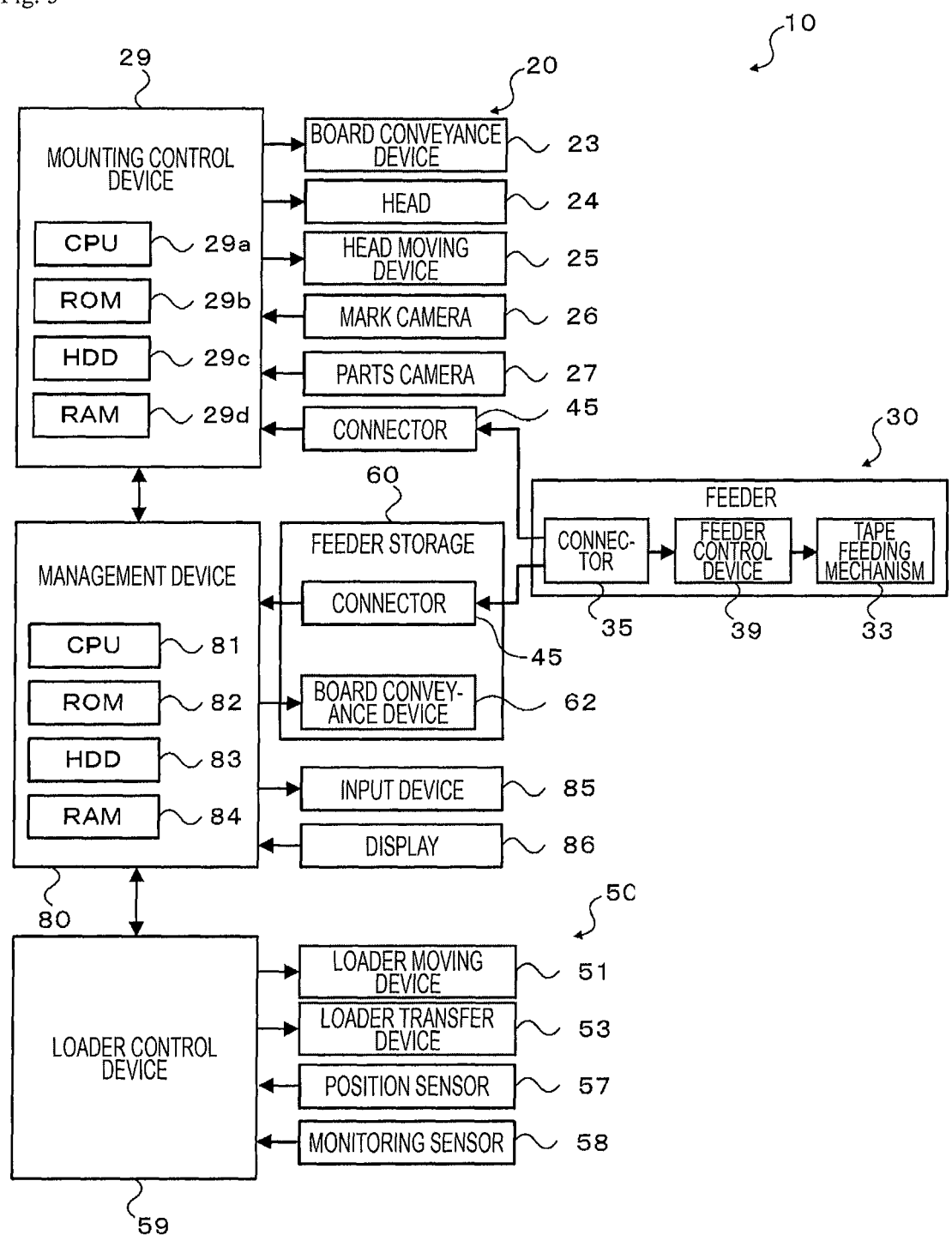
FIG. 5 is a block diagram illustrating electrical connection relationships of the component mounting system.

FIG. 1 is a schematic configuration diagram of a component mounting system. FIG. 2 is a schematic configuration diagram of a component mounting machine and a feeder. FIG. 3 is a schematic configuration diagram of the feeder. FIG. 4 is a schematic configuration diagram of a loader. FIG. 5 is a block diagram illustrating electrical connection relationships of the component mounting system. In FIGS. 1 and 2, a left-right direction is defined as an X-axis direction, a front-rear direction is defined as a Y-axis direction, and an up-down direction is defined as a Z-axis direction.

Component mounting system 10 is a system for producing a mounted board by mounting components on board S on which solders are printed, and includes, as illustrated in FIG. 1, printing device 12, print inspection device 14, multiple component mounting machines 20, a mounting inspection device (not illustrated), loader 50, feeder storage 60, and management device 80 for managing the entire system. Printing device 12 prints solder on a front surface of board S. Print inspection device 14 inspects a state of the solder printed by printing device 12. Component mounting machine 20 picks up a component supplied from feeder 30 with a suction nozzle (pickup member) and mounts the component on board S. The mount inspection device inspects a mounting state of the component mounted by component mounting machine 20. Feeder storage 60 stores feeder 30 of a use plan in component mounting machines 20 and used feeders 30. Printing device 12, print inspection device 14, feeder storage 60, component mounting machine 20, and a mount inspection device are arranged in this procedure along the conveyance direction of board S from an upstream side to constitute a production line. In the production line, two conveyance lanes extending in parallel are provided as conveyance lanes of board S.

As illustrated in FIG. 2, component mounting machine 20 includes board conveyance device 22 that conveys board S in the X-axis direction, head 25, head moving device 24 that moves head 25 in the horizontal direction (XY-axis direction), and mounting control device 29 (see FIG. 5). Board conveyance device 22 transports board S in each of the two conveyance lanes. Although not illustrated, head 25 includes a suction nozzle for picking up the component, and a lifting and lowering device for lifting and lowering the suction nozzle by a ball screw mechanism, a motor, or the like. Head moving device 24 includes slider 24a to which head 25 is attached, and a motor (not illustrated) that moves slider 24a in the horizontal direction (XY-axis direction) via a ball screw mechanism or the like.

In addition, component mounting machine 20 also includes mark camera 26, parts camera 27, and the like. Mark camera 26 captures an image of a reference mark attached to board S from above in order to detect the position of board S. Parts camera 27 captures an image of a component picked up by the suction nozzle from below in order to detect a pickup error or a pickup deviation.

As illustrated in FIG. 5, mounting control device 29 includes well-known CPU 29a, ROM 29b, HDD 29c, RAM 29d, and the like. Mounting control device 29 inputs image signals such as from mark camera 26 and parts camera 27. In addition, mounting control device 29 outputs drive signals to board conveyance device 22, head 25, head moving device 24, and the like.

CPU 29a of mounting control device 29 controls head moving device 24 so that head 25 moves above the component supplied from feeder 30 when executing a job (mounting job) for mounting the component on board S. Subsequently, CPU 29a controls head 25 so that the suction nozzle is lowered by the lifting and lowering device so that the component is picked up by the suction nozzle. CPU 29a controls head moving device 24 so that the component picked up by the suction nozzle moves above parts camera 27, and captures an image of the component with parts camera 27. CPU 29a processes the captured image of the component, measures the suction deviation amount of the component, and corrects the mounting position of the component on board S based on the measured suction deviation amount. Then, CPU 29a controls head moving device 24 so that the component picked up by the nozzle moves above the corrected mounting position, and controls head 25 so that the component is mounted on board S by lowering the suction nozzle by the lifting and lowering device.

As illustrated in FIG. 3, feeder 30 is a rectangular cassette-type tape feeder, and is detachably held by feeder base 40. Feeder 30 includes tape reel 32, tape feeding mechanism 33, connector 35, rail member 37, and feeder control device 39 (see FIG. 5). Tape 31 is wound on tape reel 32. Tape 31 has cavities formed at predetermined intervals along a longitudinal direction thereof. Each cavity accommodates the component. These components are protected by a film covering a front surface of tape 31. Tape feeding mechanism 33 is a mechanism for drawing tape 31 from tape reel 32 and feeding tape 31 to the component supply position. A film of the component accommodated in tape 31 is peeled off before the component supply position to be in an exposed state at the component supply position, and is picked up by head 25 (suction nozzle). Two positioning pins 34 protruding in a mounting direction are provided on both sides of connector 35. Rail member 37 is provided at a lower end of feeder 30 and extends in the mounting direction. Feeder control device 39 includes a well-known CPU, ROM, RAM, or the like, and outputs a drive signal to tape feeding mechanism 33 (feeding motor). Feeder control device 39 can communicate with a control section (mounting control device 29, management device 80, or the like) of the attachment destination to which feeder 30 is attached via connector 35.

As illustrated in FIG. 2, feeder base 40 is a base having an L-shaped side view and has slot 42, two positioning holes 44, and connector 45. Rail member 37 of feeder 30 is inserted into slot 42. Two positioning pins 34 of feeder 30 are inserted into two positioning holes 44, and feeder 30 is positioned at feeder base 40. Connector 45 is provided between two positioning holes 44 and is connected with connector 35 of feeder 30.

As illustrated in FIG. 1, loader 50 moves along guide rail 18 provided on a front surface of multiple component mounting machines 20 and a front surface of feeder storage in parallel with the conveyance direction (X-axis direction) of board S, and performs exchange of feeder 30 between each component mounting machine 20 and feeder storage 60. As illustrated in FIG. 4, loader 50 includes, in addition to loader moving device 51 and feeder transfer device 53, position sensor 57, monitoring sensor 58, and loader control device 59 as illustrated in FIG. 5. Loader moving device 51 includes X-axis motor 52a that drives a driving belt for moving loader and guide roller 52b that rolls on guide rail 18.

Feeder transfer device 53 transfers feeder 30 between loader 50 and feeder base 40 of component mounting machine 20 at a position opposite to each other. Feeder transfer device 53 has clamp portion 54 for clamping feeder 30 and Y-axis slider 55 including Y-axis motor for moving clamp portion 54 along Y-axis guide rail 55b. When transferring feeder 30 from loader 50 to component mounting machine 20, feeder transfer device 53 clamps feeder 30 in loader by clamp portion 54, slides Y-axis slider 55 (clamp portion 54) in a direction approaching feeder base 40 by Y-axis motor 55a (rear in FIG. 4), and cancels the clamp of clamp portion 54. As a result, rail member 37 of feeder 30 is inserted into slot 42 of feeder base 40 and is attached to feeder base 40. In addition, when transferring feeder 30 from component mounting machine 20 to loader 50, feeder transfer device 53 causes Y-axis motor 55a to slide Y-axis slider 55 in the direction approaching feeder base 40, so that feeder 30 attached to feeder base 40 is clamped by clamp portion 54. Then, feeder transfer device 53 causes Y-axis motor 55a to slide Y-axis slider in a direction separating from feeder base 40 (front in FIG. 4), thereby releasing the clamp of clamp portion 54 in loader 50. As a result, feeder 30 is removed from feeder table 40 and collected in loader 50.

Position sensor 57 is an encoder that detects a movement position of loader 50 in the left-right direction (X-axis direction). Monitoring sensor 58 monitors the presence or absence of an obstacle (operator) in the left-right direction (X-axis direction) of loader 50, and is configured as, for example, a laser scanner. Loader control device 59 includes a well-known CPU, ROM, RAM, and the like, receives detection signals from position sensor 57 and monitoring sensor 58, and outputs drive signals to loader moving device 51 and feeder transfer device 53.

In order to store multiple feeders 30, feeder storage 60 is provided with feeder base 40 having the same configuration as feeder base 40 of component mounting machine 20 described above at the same height as feeder base 40 of component mounting machine 20. Therefore, loader 50 can attach and detach feeder 30 to and from feeder base 40 of feeder storage in the same operation as attaching and detaching feeder 30 to and from feeder base 40 of component mounting machine 20 at the position facing feeder storage 60. Board conveyance device 62 for transferring board S paid out from print inspection device 14 to most upstream component mounting machine 20 among multiple component mounting machines 20 is provided behind feeder storage 60 (rear surface side).

When an instruction to change setup or exchange feeder 30 in which component shortage occurs is given with the designation of the storage position of feeder 30 in feeder storage 60 and the mounting position of feeder 30 in component mounting machine 20, loader control device 59 of loader 50 controls loader moving device 51 so that loader 50 moves to the target position by setting the position facing the designated storage position of feeder storage as the target position. When loader 50 reaches the target position, loader control device 59 causes feeder transfer device 53 to transfer feeder 30 at the storage position designated from feeder storage 60 into loader 50. Next, loader control device 59 controls loader moving device 51 so that loader 50 moves to the target position with the position facing the designated mounting position of component mounting machine 20 as the target position. When loader 50 reaches the target position, loader control device 59 causes feeder transfer device 53 so as to mount feeder 30 at the designated mounting position of component mounting machine 20. As required, loader control device 59 causes feeder transfer device 53 so as to collect used feeder 30 from component mounting machine 20. When an obstacle is detected by monitoring sensor 58 during the traveling of loader 50, loader control device 59 stops the traveling until the obstacle is not detected.

Management device 80 is a general-purpose computer, and as illustrated in FIG. 5, includes CPU 81, ROM 82, HDD 83 (storage device), and RAM 84. Input device 85 such as a keyboard and a mouse, and display 86 are electrically connected to management device 80. In addition to the production schedule, HDD 83 stores feeder holding information, job (mounting job) information, status information, and the like as various information required for production. These pieces of information are managed for each component mounting machine 20. Here, the production schedule is a schedule that specifies which components are mounted on which board S in which the procedure number in each component mounting machine 20, how many boards S (products) mounted in that manner is produced, and the like. The feeder holding information is information on feeder 30 held by each component mounting machine 20 and feeder storage 60. The feeder holding information includes positional information (slot number) of the mounting position of feeder 30, ID information of feeder 30, information of the component type accommodated in feeder 30, information of the number of remaining components, and the like, and these pieces of information are associated with each other and stored in the HDD 83 for each component mounting machine 20. The feeder holding information is acquired from mounting control device 29 of each component mounting machine 20 to management device 80 during the production and is updated as appropriate. The job information is information on a mounting instruction (production instruction of the board type) with respect to each component mounting machine 20. The job information includes the type of the suction nozzle, the type (component type) and size of the component to be mounted, the mounting position, and the like, and these pieces of information are associated with each other for each job and stored in the HDD 83. The status information is information indicating the operation status of each component mounting machine 20. The status information includes during the production, during setup change, during abnormality occurrence, and the like. The status information is acquired from each component mounting machine 20 to management device 80 and updated as appropriate.

Management device 80 is communicably connected to mounting control device 29 with each other by wire, and exchanges various information with each component mounting machine 20. Management device 80 receives the operation status from each component mounting machine 20 and updates the status information to the latest one. In addition, management device 80 is communicably connected to feeder control device 39 of feeder 30 attached to feeder base 40 of each component mounting machine 20 via mounting control device 29. When feeder 30 is removed from component mounting machine 20 or new feeder 30 is attached to component mounting machine 20, management device 80 receives an attachment or detachment status from corresponding component mounting machine 20 and updates the feeder holding information to a latest one. In addition, management device 80 is communicably connected to loader control device 59 wirelessly, and exchanges various information with loader 50. In addition to what has been described above, management device 80 is also communicably connected to each control device of printing device 12, print inspection device 14, and the mount inspection device, and also exchanges various information from the corresponding devices.

Figure 6:
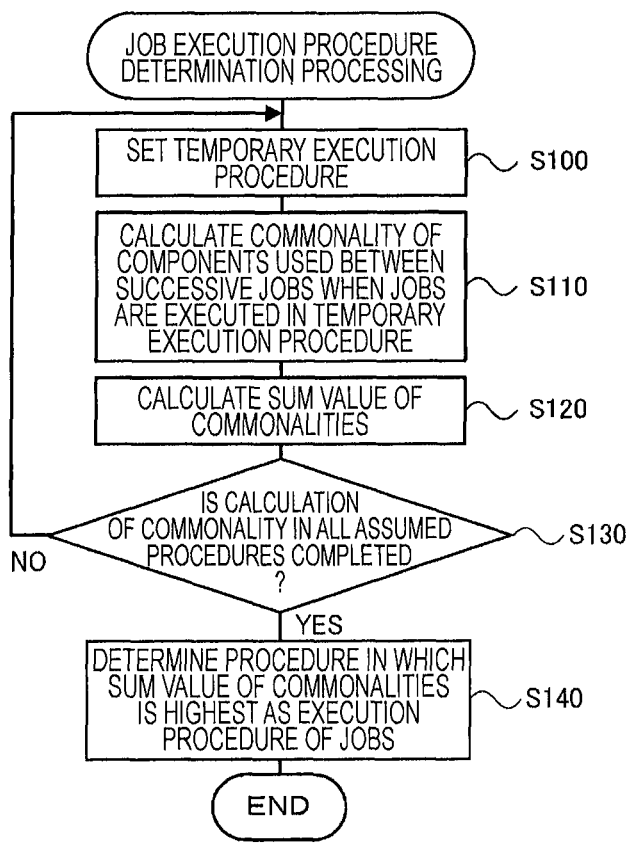
FIG. 6 is a flowchart illustrating an example of job execution procedure determination processing.

Next, an operation of component mounting system 10 configured as described above will be described. In particular, an operation for determining an execution procedure when each component mounting machine 20 executes multiple jobs (production of multiple board types) and an operation for switching jobs executed in accordance with the determined execution procedure will be described. FIG. 6 is a flowchart illustrating an example of job execution procedure determination processing executed by CPU 81 of management device 80. This processing is executed when execution of multiple jobs is requested via input device 85.

When the job execution procedure determination processing is executed, CPU 81 of management device 80 first sets a temporary execution procedure as the execution procedure of multiple jobs to be executed (step S100). Subsequently, CPU 81 calculates, for each job, the commonality of components to be used between two previous and subsequent successive jobs each other in a case where jobs are executed in the temporary execution procedure (step S110), and calculates a sum value of the calculated commonalities (step S120). Here, the commonality indicates a ratio (%) of a component type that is the same as that of a component (feeder) used in a previous job among components (feeders) used in a later job, and can be determined based on information on the component type included in each job.

Next, CPU 81 determines whether the calculation of the sum value of the commonalities has been completed in all the assumed procedures (step S130). If it is determined that the calculation of the sum value of the commonalities in any of the assumed procedures is not completed, CPU 81 returns to step S100, sets another temporary execution procedure, and repetitively executes the calculation of the commonalities in the execution procedure and the calculation of the sum values.

If it is determined in step S130 that the calculation of the sum value of the commonalities is completed in all the assumed procedures, CPU 81 determines the procedure in which the sum value of the commonalities is highest in the execution procedure of the jobs (step S140), and completes the job execution procedure determination processing.

FIG. 7 is an explanatory diagram illustrating an example of the execution procedure of multiple (six) jobs and the commonality of components used between two previous and subsequent successive jobs in a case where multiple jobs are executed in that procedure. When the execution of six jobs JOB_A to JOB_F is requested, CPU 81 sets a temporary execution procedure, obtains the commonality of components used between two previous and subsequent successive jobs in the set temporary execution procedure (between JOB_A and JOB B, between JOB B and JOB_C, between JOB_C and JOB_D, between JOB_D and JOB_E, and between JOB_E and JOB_F in the drawing), and calculates the sum value. Furthermore, CPU 81 changes the procedure until the calculation of the sum value in all the assumed execution procedures is completed, obtains the commonality of the components used between the two previous and subsequent successive jobs, and calculates the sum value. Then, CPU 81 determines, as the execution procedure of the jobs, the procedure in which the highest value was obtained among respective sum values obtained in all the procedures.

Figures 8, 9:
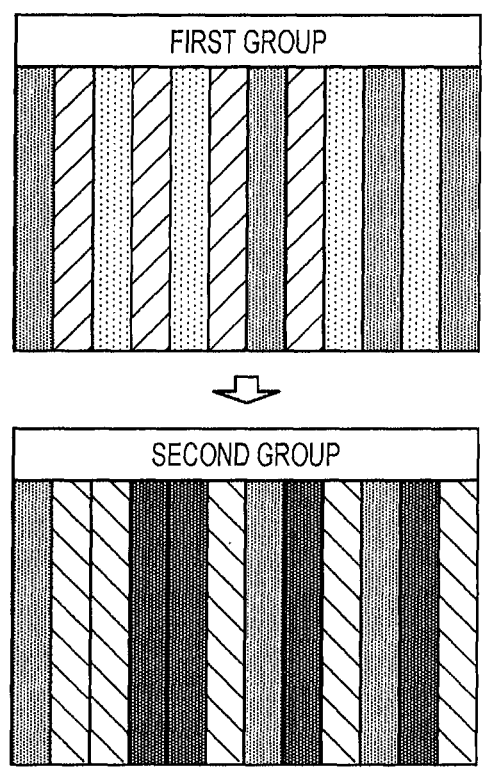
FIG. 8 is an explanatory diagram illustrating jobs for each group in a case where multiple jobs are grouped.
FIG. 9 is an explanatory diagram illustrating a state of an arrangement of feeders for each group in a case where the feeders are collectively exchanged for each group.
Figure 10:
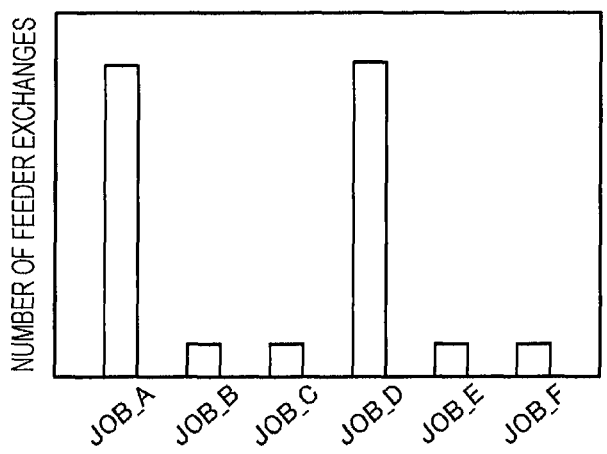
FIG. 10 is an explanatory diagram illustrating the number of exchanges of feeders required to switch jobs in a case where multiple jobs are executed in the execution procedure of a comparative example.
Figure 11:
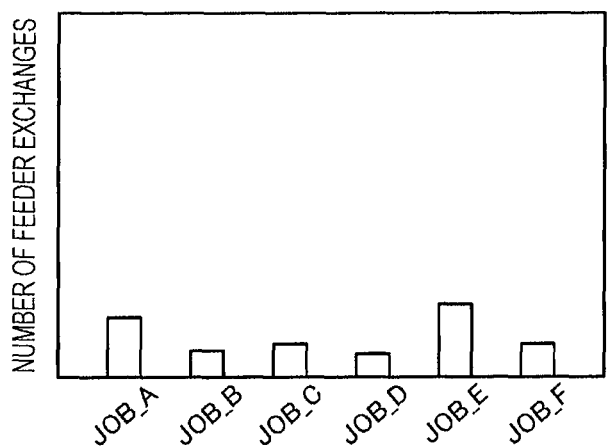
FIG. 11 is an explanatory diagram illustrating the number of exchanges of feeders required to switch jobs in a case where multiple jobs are executed in the execution procedure of the present embodiment.

FIG. 8 is an explanatory diagram illustrating jobs for each group in a case where multiple jobs are grouped. FIG. 9 is an explanatory diagram illustrating a state of an arrangement of feeders for each group in a case where the feeders are collectively exchanged for each group. FIGS. 10 and 11 are explanatory diagrams illustrating comparative examples, respectively, and the number of exchanges of feeders required to switch jobs in a case where multiple jobs are executed in the execution procedure of the present embodiment. In the comparative example, as illustrated in FIGS. 8 and 9, the group of feeders 30 to be collectively exchanged is set as a group, the six jobs JOB_A to JOB_F to be executed are divided into a first group and a second group, the group of feeders 30 used in jobs JOB_A to JOB_C of the first group to be executed first is attached to feeder base 40, when the execution of jobs JOB_A to JOB_C of the first group is completed, the group of feeders 30 of the first group attached to feeder base 40 is detached, and the group of feeders 30 used in jobs JOB_D to JOB_F of the second group is instead attached to feeder base 40. In this case, the number of exchanges of feeders 30 is such that exchange of feeders 30 does not occur in a case where jobs are switched in the same group, but exchange of feeders 30 occurs only in a case where component shortage occurs during the production. On the other hand, in a case where jobs are switched across groups, a large number of feeders 30 must be exchanged at once. Therefore, as illustrated in FIG. 10, the number of exchanges of feeders 30 for each job is greatly biased, so that a long waiting time is locally generated in the exchange of feeders 30. In the present embodiment, since the exchange operation of feeder 30 is performed one by one by loader 50, if a long waiting time occurs locally in the exchange of feeder 30, the start of the next job is greatly delayed. On the other hand, in the present embodiment, all the procedures are assumed as the execution procedures of the six jobs JOB_A to JOB_F, and the procedure in which the sum value of the commonalities obtained in each procedure is the highest is determined as the execution procedure of the jobs. As a result, as illustrated in FIG. 11, since the number of exchanges of feeders 30 for each job is leveled, even if loader 50 exchanges feeders 30 one by one, it is possible to suppress the occurrence of a locally long waiting time in the exchange of feeders 30, and the job can be smoothly switched.

Figure 12:
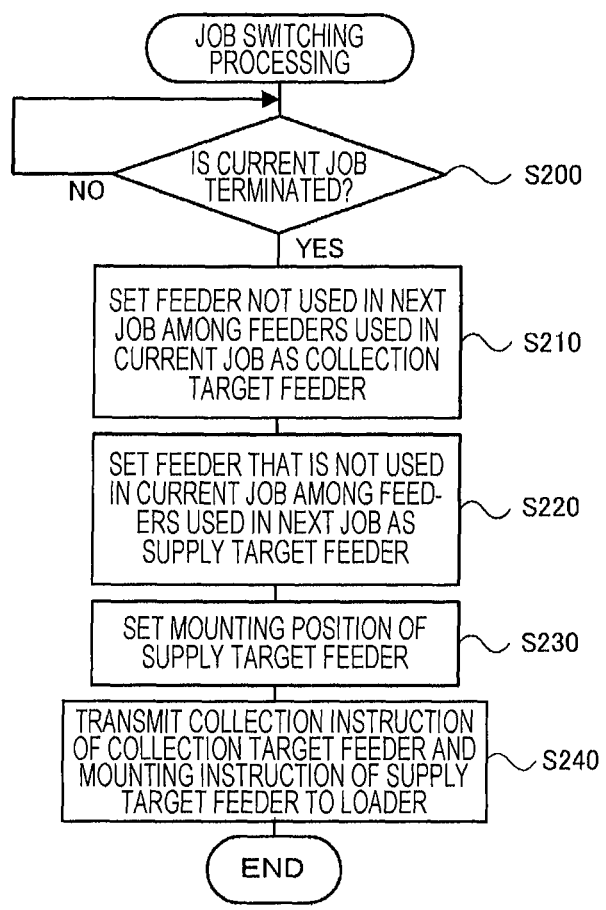
FIG. 12 is a flowchart illustrating an example of job switching processing.

FIG. 12 is a flowchart illustrating an example of the job switching processing executed by CPU 81 of management device 80. CPU 81 of management device 80 first determines whether the current job is completed (step S200). This processing is performed by checking the status information. Subsequently, when determining that the present job is completed, CPU 81 sets feeder 30 that is not used in the next job among feeders 30 used in the present job as the collection target feeder (step S210). Next, CPU 81 sets feeder 30, which is not used in the present job, among feeders 30 used in the next job, as the supply target feeder (step S220), and sets the mounting position of the supply target feeder (step S230). The processing of step S230 is performed by setting a position closer to parts camera 27 among the empty slots of feeder base 40 including the slots that are empty by the collection of the collection target feeder to the mounting position of the supply target feeder. Then, CPU 81 transmits a collecting instruction of the collection target feeder and a mounting instruction of the supply target feeder to the set mounting position, to loader 50 (loader control device 59) (step S240), and terminates the job switching processing.

Figure 13:
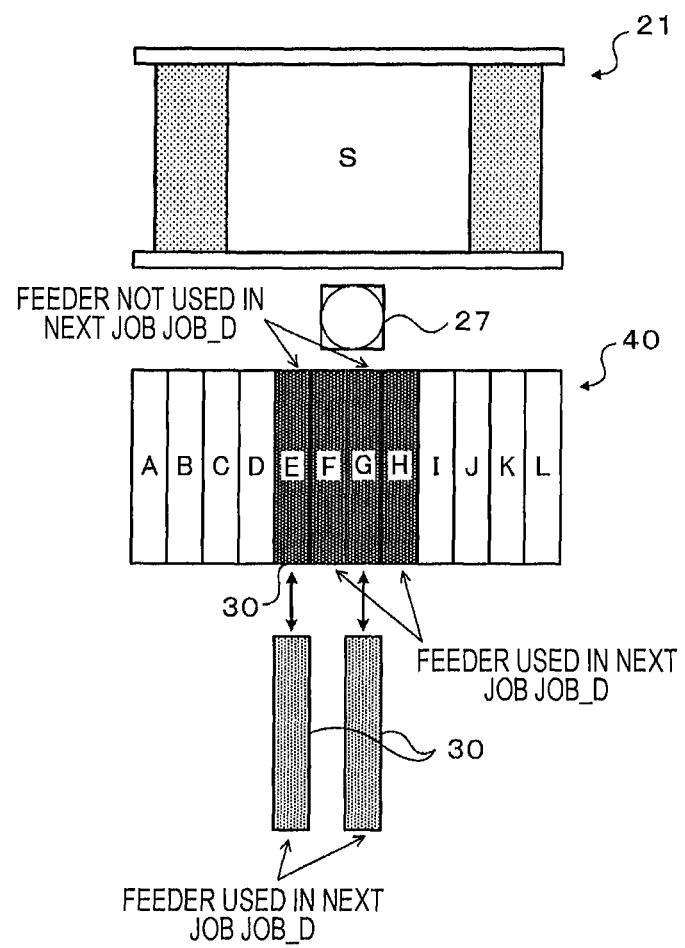
FIG. 13 is an explanatory diagram illustrating a state of job switching.

FIG. 13 is an explanatory diagram illustrating a state of job switching. As illustrated in the drawing, in a case where the job is switched from job JOB_E to job JOB_D, loader 50 (loader control device 59) collects feeder 30 that is not used in next job JOB_D as the collection target feeder while holding feeder 30 used in next job JOB_D among feeders 30 used in job JOB_E, at the mounting position of feeder 30. Then, loader 50 (loader control device 59) attaches new feeder 30 used in next job JOB_D to the slot closer to parts camera 27 among the empty slots including the empty slot by the collection target feeder. As described above, in the mounting processing, head 25 moves from the suction position of the component to the mounting position of board S via the upper side of parts camera 27. Therefore, by arranging feeder 30 close to parts camera 27, the movement distance of head 25 can be shortened, and the mounting efficiency can be further improved.

Here, a correspondence between principal elements of the present embodiment and principal elements disclosed in the columns of the claims will be described. That is, each slot 42 of feeder base 40 of the present embodiment corresponds to the attachment target section of the present disclosure, component mounting machine 20 corresponds to the mounting machine, CPU 81 of management device 80 that executes the job execution procedure determination processing corresponds to the execution procedure determination section, and CPU 81 of management device 80 and loader 50 that execute the job switching processing correspond to the job switching section. In addition, parts camera 27 corresponds to an imaging device. In addition, loader 50 corresponds to a feeder exchange device.

Needless to say, the present disclosure is not limited to the embodiment that has been described heretofore in any way, and hence can be carried out in various manners without departing from the technical scope of the present disclosure.

For example, in the above embodiments, in the job execution procedure determination processing, CPU 81 calculates the commonality of components used between two previous and subsequent successive jobs in all procedures, and determines the procedure in which the sum value of the commonalities is highest as the execution procedure of the jobs. However, in a case where the use of the specific procedure is prohibited by any constraint, CPU 81 may determine, as the execution procedure of the jobs, a procedure in which the sum value of the commonalities is the highest among the assumed procedures excluding the specific procedure.

Figure 14:
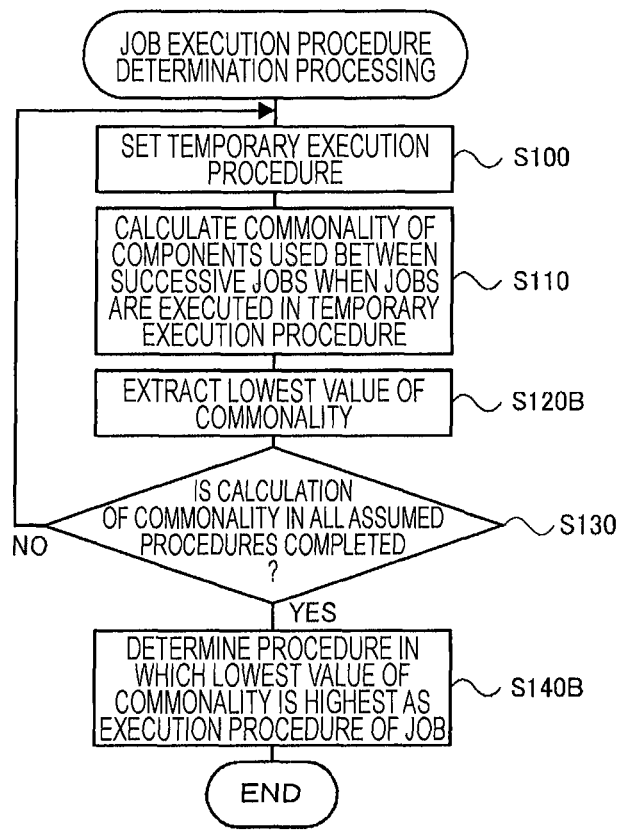
FIG. 14 is a flowchart illustrating job execution procedure determination processing according to a modification example.

In the above embodiments, CPU 81 determines the execution procedure of the jobs by executing the job procedure determination processing in FIG. 6. However, CPU 81 may determine the execution procedure of the jobs by executing the job execution procedure determination processing illustrated in FIG. 14 instead of FIG. 6. Among the job execution procedure determination processing of this modification example, the same processing as the processing in FIG. 6 is assigned with the same step numbers, and the descriptions thereof will be omitted because they are duplicate. In the job execution procedure determination processing of the modification example, CPU 81 calculates the commonality of components used between two previous and subsequent successive jobs in the temporary execution procedure set in steps S100 and S110, and then derives the lowest value of the commonality (step S120B). Then, CPU 81 repeats the above-described steps S100, S110, and S120B until it is determined that the calculation of the commonality is completed in all the procedures assumed in step S130. When the calculation of the commonality is completed in all the procedures, CPU 81 determines the procedure in which the lowest value of the commonality is highest as the execution procedure of the jobs (step S140B), and terminates the job execution procedure determination processing. As a result, similarly to the present embodiment, since the number of exchanges of feeders 30 for each job is leveled, it is possible to suppress the occurrence of a locally long waiting time in the exchange of feeder 30, and the job can be smoothly switched. CPU 81 calculates the commonality of components between two previous and subsequent successive jobs in all the procedures, and determines the procedure in which the lowest value of the commonality is the highest as the execution procedure of the jobs. However, in a case where the use of the specific procedure is prohibited by any constraint, CPU 81 may determine, as the execution procedure of the jobs, a procedure in which the lowest value of the commonality is the highest among the assumed procedures excluding the specific procedure.

In the above embodiments and the modification example thereof, CPU 81 obtains the sum value and the lowest value of the commonality in the multiple assumed procedures, and determines the highest procedure of the sum value and the lowest value obtained in each procedure as the execution procedure of the jobs. However, CPU 81 may derive a procedure in which the sum value and the lowest value are optimum in leveling the number of exchanges of feeders 30 for each job using an optimization algorithm such as a genetic algorithm.

Figure 15:
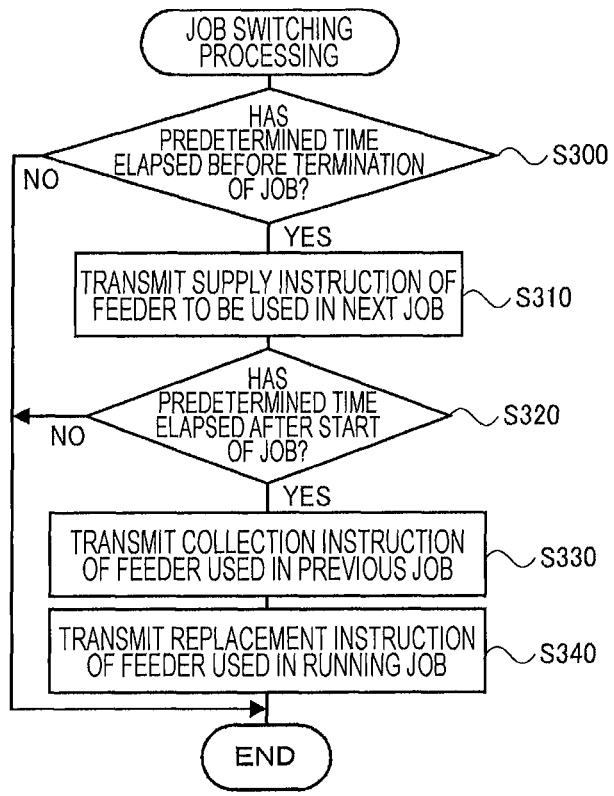
FIG. 15 is a flowchart illustrating job switching processing according to a modification example.

In the above embodiments, only feeder 30 used in the running job is attached to feeder base 40 of component mounting machine 20. However, if there is room in the empty slot, in addition to feeder 30 used in the job being executed, feeder 30 used in the next running job may also be mounted on feeder base 40 in advance. FIG. 15 is a flowchart illustrating an example of the job switching processing in this case. As illustrated in the drawing, in the job switching processing, CPU 81 first determines whether a predetermined time period before the termination of the running job has elapsed (step S300). When determining that the predetermined time period before the termination has not elapsed, CPU 81 terminates the job switching processing. On the other hand, when determining that a predetermined time period before the termination has elapsed, CPU 81 transmits a supply instruction to loader control device 59 to supply (mounting) feeder 30 used in the next job to the empty slot of feeder base 40 (step S310). Here, the pre-termination predetermined time period can be determined based on the required time period by obtaining in advance the required time period for loader 50 to attach the number of feeders 30 to feeder base 40 based on the number of feeders 30 to be supplied or the like.

Next, CPU 81 determines whether a predetermined time period has elapsed after the start of the running job (step S320). Here, the predetermined time period after the start is determined so as to be a timing immediately after the start of the running job or a timing at which a predetermined time period has elapsed from the start of the job. If it is determined that the predetermined time period has not elapsed after the start, CPU 81 terminates the job switching processing. On the other hand, if it is determined that the predetermined time period has elapsed after the start, CPU 81 transmits, to loader control device 59, an instruction to collect feeder 30 used in the previous job (step S330). Then, CPU 81 transmits a replacement instruction to loader control device 59 to replace the mounting position of feeder 30 used in the running job so as to have a displacement optimum for production, for example, a displacement in the vicinity of parts camera 27 (step S340), and terminates the job switching processing.

The replacement of feeder 30 based on the replacement instruction is performed during the execution of the job. For example, the replacement of feeder 30 can be performed so as to change the displacement of one feeder 30 between the time when the supply of the component of one feeder 30 to one board S is terminated during the execution of the job and the time when the supply of the component to the next board S is started by one feeder 30. In addition, the replacement of feeder 30 can be performed such that, in a case where boards S of different board types are transported to multiple (two) conveyance lanes, respectively, and the mounting processing is subsequently performed by single head 25, the displacement of feeder 30 used in only one lane is changed while the mounting processing is performed in the other one of the multiple conveyance lanes. As a result, feeder 30 can be efficiently replaced without obstructing the execution of the job.

Figure 16:
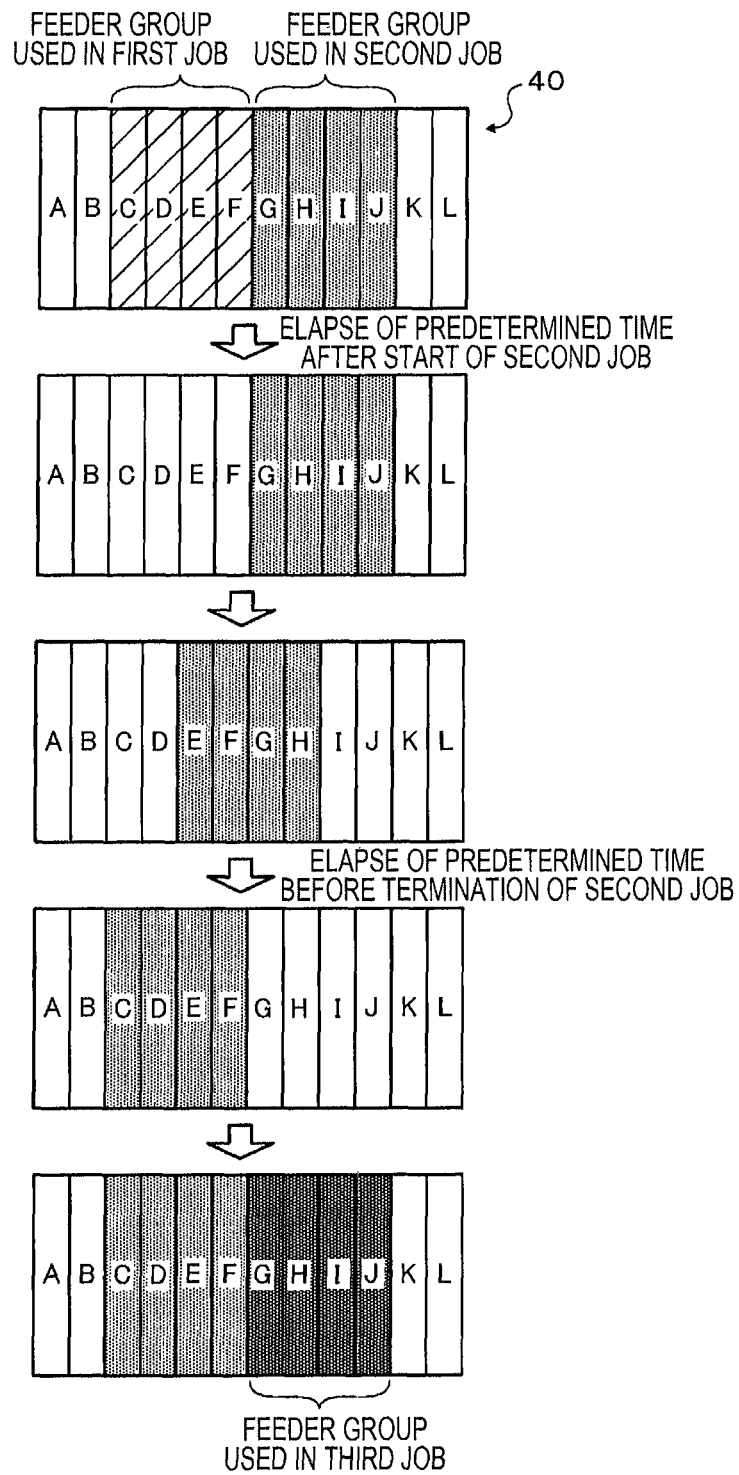
FIG. 16 is an explanatory diagram illustrating a state in which the feeder is replaced during execution of the job.

FIG. 16 is an explanatory diagram illustrating a state in which the feeder is replaced during execution of the job. As illustrated in the drawing, in the modification example, since feeder 30 used in the next second job is attached to feeder base 40 during the execution of the first job, it is possible to shorten the time required for the setup change. However, feeder 30 used in the first job being executed is attached to feeder base 40, and feeder 30 used in the next second job is attached to empty slot 42 of feeder base 40. Therefore, the displacement of feeder 30 used in the next second job is not necessarily disposed optimum for production. Therefore, in a modification example, when the execution of the first job is terminated and the next second job is switched to the running job, loader 50 (loader control device 59) collects feeder 30 used in the immediately preceding first job, and thereafter replaces feeder 30 used in the second job being executed with the optimum displacement. As a result, it is possible to achieve both shortening of the setup change time and improvement of the production efficiency. When a predetermined time period before the termination of the second job elapses during the execution of the second job, loader 50 (loader control device 59) attaches feeder 30 used in the next third job to empty slot 42 of feeder base 40.

In the above embodiments, head 25 includes a lifting and lowering device capable of lifting and lowering the nozzle. However, head 25 may include multiple lifting and lowering devices capable of lifting and lowering the nozzles at predetermined intervals. In this case, in step S230 of the job switching processing in FIG. 12 or step S340 of the job switching processing in FIG. 15, multiple feeders 30 may be disposed so as to be able to supply components at approximately the same interval as the interval of the nozzles that are lifted and lowered by multiple lifting and lowering devices, respectively. As a result, it is possible to substantially simultaneously pick up multiple components supplied from multiple feeders 30 with multiple nozzles, and the mounting efficiency can be further improved.

As described above, the component mounting system of the present disclosure is a component mounting system including a component mounting machine configured to execute a mounting job taking out and mounting components supplied from a feeder mounted on any of multiple attachment target sections, the component mounting system for managing multiple mounting jobs to be executed by the component mounting machine, the component mounting system further including an execution procedure determination section configured to obtain a sum value or a lowest value of a ratio of components used in common between previous and subsequent successive mounting jobs when the component mounting machine respectively executes the multiple mounting jobs in multiple assumed procedures, and determine the execution procedure of the multiple mounting jobs based on the sum value or the lowest value respectively obtained in the multiple procedures; and a job switching section configured to hold, in the attachment target section, a feeder accommodating a component common to a component used in the subsequent mounting job among components used in the previous mounting job when the previous and subsequent successive mounting jobs in the execution procedure determined by the execution procedure determination section are switched, and mounts, on an empty attachment target section that is a attachment target section emptied among the multiple attachment target sections, a feeder accommodating a component not common to a component used in the previous mounting job among components used in the subsequent mounting job.

As a result, in a case where multiple mounting jobs are executed, the time required for the setup change can be leveled between the respective mounting jobs. As a result, it is possible to suppress an occurrence of a long waiting time between parts of mounting jobs in switching of the mounting jobs and improve production efficiency.

In such a component mounting system of the present disclosure, the execution procedure determination section may determine the procedure in which the sum value or the lowest value is a maximum from the multiple procedures as the execution procedure of the mounting job. By doing so, it is possible to more appropriately level the time required for the setup change.

In the component mounting system of the present disclosure, the component mounting machine may include an imaging device for capturing an image of the component and mount a component taken out from the feeder after capturing the image of the component, and the job switching section may mount, on the empty attachment target section closer to the imaging device, the feeder accommodating a component not common to a component used in the previous mounting job among components used in the subsequent mounting job. By doing so, it is possible to further improve the mounting efficiency (production efficiency) while appropriately leveling the time required for the setup change.

Further, in the component mounting system of the present disclosure, the job switching section may mount, during the execution of the previous mounting job, the feeder accommodating a component not common to a component used in the previous mounting job among components used in the subsequent mounting job, and when the execution of the previous mounting job is terminated and the execution of the subsequent mounting job is started, collect a feeder accommodating a component not used in the subsequent mounting job among components used in the previous mounting job during the execution of the subsequent mounting job, and change a mounting position of the feeder accommodating a component used in the subsequent mounting job between multiple empty attachment target section including the empty attachment target section generated by the collection. By doing so, both shortening of the time required for the setup change and optimization of the displacement of the feeder can be achieved, and the production efficiency can be further improved.

In the component mounting system according to the present disclosure, the job switching section may include a feeder exchange device that individually exchange a feeder with respect to the multiple attachment target sections of the component mounting machine. By doing so, the exchange of the feeder can be automated, and the workload on the worker can be further reduced. In addition, in a case where the feeder is individually exchanged using the feeder exchange device, it is possible to suppress an occurrence of a long waiting time between a part of mounting jobs.

INDUSTRIAL APPLICABILITY

The present disclosure can be used in the producing industry of the component mounting system and the like.

REFERENCE SIGNS LIST

10 component mounting system, 12 printing device, 14 printing inspection device, 18 guide rail, 20 component mounting machine, 22 board conveyance device, 24 head moving device, 24a slider, 25 head, 26 mark camera, 27 parts camera, 29 mounting control device, feeder, 31 tape, 32 tape reel, 33 tape feeding mechanism, 34 positioning pin, 35 connector, 37 rail member, 39 feeder control device, 40 feeder base, 42 slot, 44 positioning hole, 45 connector, loader, 51 loader moving device, 52a X-axis motor, 52b guide roller, 53 feeder transfer device, 54 clamp section, 55 Y-axis slider, 55a Y-axis motor, 55b Y-axis guide rail, 57 position sensor, 58 monitoring sensor, 59 loader control device, 60 feeder storage, 80 management device, 81 CPU, 82 ROM, 83 HDD, 84 RAM, 85 input device, 86 display, S board

The invention claimed is:

1. A component mounting system comprising:
   a component mounting machine configured to execute a mounting job taking out and mounting components supplied from a feeder mounted on any of multiple attachment target sections,
      the component mounting system for managing multiple mounting jobs to be executed by the component mounting machine, the component mounting system further comprising: an execution procedure determination section configured to obtain a sum value or a lowest value of a ratio of components used in common between previous and subsequent successive mounting jobs when the component mounting machine respectively executes the multiple mounting jobs in multiple assumed procedures, and determine the execution procedure of the multiple mounting jobs based on the sum value or the lowest value respectively obtained in the multiple procedures; and
   a job switching section configured to hold, in the attachment target section, a feeder accommodating a component common to a component used in the subsequent mounting job among components used in the previous mounting job when the previous and subsequent successive mounting jobs in the execution procedure determined by the execution procedure determination section are switched, and mount, on an empty attachment target section that is a attachment target section emptied among the multiple attachment target sections, a feeder accommodating a component not common to a component used in the previous mounting job among components used in the subsequent mounting job.

2. The component mounting system according to claim 1, wherein the execution procedure determination section determines the procedure in which the sum value or the lowest value is a maximum from the multiple procedures as the execution procedure of the mounting job.

3. The component mounting system according to claim 1, wherein the component mounting machine includes an imaging device for capturing an image of the component and mounts a component taken out from the feeder after capturing the image of the component by the imaging device, and
   the job switching section mounts on the empty attachment target section closer to the imaging device, the feeder accommodating a component not common to a component used in the previous mounting job among components used in the subsequent mounting job.

4. The component mounting system according to claim 1, wherein the job switching section mounts during the execution of the previous mounting job, the feeder accommodating a component not common to a component used in the previous mounting job among components used in the subsequent mounting job, and when the execution of the previous mounting job is terminated and the execution of the subsequent mounting job is started, collects a feeder accommodating a component not used in the subsequent mounting job among components used in the previous mounting job during the execution of the subsequent mounting job, and changes a mounting position of the feeder accommodating a component used in the subsequent mounting job between multiple empty attachment target sections including the empty attachment target section generated by the collection.

5. The component mounting system according to claim 1, wherein the job switching section includes a feeder exchange device configured to individually exchange a feeder with respect to the multiple attachment target sections of the component mounting machine.

\* \* \* \* \*